(12) United States Patent
Han et al.

(10) Patent No.: US 12,079,491 B2
(45) Date of Patent: Sep. 3, 2024

(54) MEMORY SYSTEM INCLUDING MEMORY DEVICE AND MEMORY CONTROLLER, AND OPERATING METHOD THEREOF

(71) Applicant: Samsung Electronics Co., Ltd., Suwon-si (KR)

(72) Inventors: Taewoo Han, Suwon-si (KR); Wooil Kim, Suwon-si (KR); Taehun Kim, Suwon-si (KR)

(73) Assignees: Samsung Electronics Co., Ltd., Gyeonggi-do (KR); Dongguk University Industry-Academic Cooperation Foundation, Seoul (KR)

( * ) Notice: Subject to any disclaimer, the term of this patent is extended or adjusted under 35 U.S.C. 154(b) by 50 days.

(21) Appl. No.: 18/150,626

(22) Filed: Jan. 5, 2023

(65) Prior Publication Data
US 2023/0266893 A1    Aug. 24, 2023

(30) Foreign Application Priority Data

Feb. 21, 2022 (KR) .................. 10-2022-0021994
Jun. 7, 2022 (KR) .................. 10-2022-0068915

(51) Int. Cl.
*G06F 3/06* (2006.01)

(52) U.S. Cl.
CPC .......... *G06F 3/0625* (2013.01); *G06F 3/0644* (2013.01); *G06F 3/0659* (2013.01); *G06F 3/0673* (2013.01)

(58) Field of Classification Search
CPC .... G06F 3/0625; G06F 3/0644; G06F 3/0659; G06F 3/0673
See application file for complete search history.

(56) References Cited

U.S. PATENT DOCUMENTS

| 7,272,692 | B2 | 9/2007 | Barnum et al. |
| 7,613,866 | B2 | 11/2009 | Niggemeier et al. |
| 9,489,321 | B2 | 11/2016 | O'Connor et al. |
| 10,318,420 | B2 | 6/2019 | Muralimanohar et al. |
| 11,042,312 | B2 | 6/2021 | Parikh et al. |
| 11,221,798 | B2 | 1/2022 | Mathews et al. |

(Continued)

OTHER PUBLICATIONS

Extended European Search Report dated Jul. 18, 2023 issued in corresponding European Patent Application No. 23157816.2.

*Primary Examiner* — Mark A Giardino, Jr.
(74) *Attorney, Agent, or Firm* — Harness, Dickey & Pierce, P.L.C.

(57) ABSTRACT

A memory system includes a memory device including a memory cell array divided into a plurality of memory banks, and a memory controller that sends read requests or write requests to the memory device for the purpose of inputting data to or outputting data from the memory banks of the memory cell array, respectively, and sends the read requests so as to be separated from the write requests based on a read-write switching point. In a first turn, the memory controller sets a near switching point before the read-write switching point. The memory controller blocks scheduling at least one of first bank requests, between the near switching point and the read-write switching point. The memory controller schedules at least one of second bank requests, which cause state switching of the memory banks, so as to be issued between the near switching point and the read-write switching point.

20 Claims, 12 Drawing Sheets

(56) References Cited

U.S. PATENT DOCUMENTS

| | | |
|---|---|---|
| 2008/0244135 A1 | 10/2008 | Akesson et al. |
| 2018/0232178 A1 | 8/2018 | Iwaki et al. |
| 2019/0303039 A1 | 10/2019 | Teh et al. |
| 2020/0065028 A1* | 2/2020 | Keil ...................... G06F 3/0659 |
| 2020/0327010 A1* | 10/2020 | Pandey ............... G06F 12/0802 |

* cited by examiner

1120 RD requestQ

| | ROW | BANK | VALID |
|---|---|---|---|
| | | | |
| | | | |
| | | | |
| | | | |
| | | | |
| R4 → | row23 | bank4 | 1 |
| R3 → | row22 | bank3 | 1 |
| R2 → | row21 | bank2 | 1 |
| R1 → | row20 | bank1 | 1 |

1130 WR requestQ

| | ROW | BANK | VALID |
|---|---|---|---|
| W9 → | row1 | bank1 | 1 |
| W8 → | row1 | bank1 | 1 |
| W7 → | row1 | bank1 | 1 |
| W6 → | row10 | bank2 | 1 |
| W5 → | row1 | bank1 | 1 |
| W4 → | row4 | bank4 | 0 |
| W3 → | row3 | bank3 | 0 |
| W2 → | row2 | bank2 | 0 |
| W1 → | row1 | bank1 | 0 |

1111 RD INFO

| Max Burst | 8 |
|---|---|
| Burst | 0 |
| Page-hit | 0 |

1112 WR INFO

| Max Burst | 8 |
|---|---|
| Burst | 4 |
| Page-hit | 4 |

1113 BANK Status

| BANK | ROW |
|---|---|
| bank4 | row4 |
| bank3 | row3 |
| bank2 | row2 |
| bank1 | row1 |

FIG. 6

MEMORY SYSTEM INCLUDING MEMORY DEVICE AND MEMORY CONTROLLER, AND OPERATING METHOD THEREOF

CROSS-REFERENCE TO RELATED APPLICATIONS

This application claims priority under 35 U.S.C. § 119 to Korean Patent Application No. 10-2022-0021994 filed on Feb. 21, 2022, in the Korean Intellectual Property Office, and Korean Patent Application No. 10-2022-0068915 filed on Jun. 7, 2022, in the Korean Intellectual Property Office, the disclosures of which are incorporated by reference herein in their entireties.

BACKGROUND

Example embodiments of the present disclosure described herein relate to a memory controller, and more particularly, relate to a memory system including a memory device and a memory controller and an operating method thereof.

A semiconductor memory device is classified as a volatile semiconductor memory device or a non-volatile semiconductor memory device. The volatile semiconductor memory device is fast in read and write speeds but loses data stored therein when a power is turned off. In contrast, even though a power is turned off, the non-volatile semiconductor memory device retains information stored therein. Therefore, the non-volatile semiconductor memory device is used to store information that is desired to be retained regardless of whether a power is supplied.

A memory system including the volatile semiconductor memory device may control the volatile semiconductor memory device through a memory controller. The memory controller may transfer various commands to the volatile semiconductor memory device for the purpose of inputting/outputting data to/from the volatile semiconductor memory device. The memory controller may, in advance, schedule the order of sending various commands such that the data input/output. However, the performance of the memory system may be affected by a method of scheduling various commands.

SUMMARY

Example embodiments of the present disclosure provide a memory system capable of separating and sending read requests and write requests through a read-write switching point and blocking the scheduling of unnecessary bank requests of this turn from a specific time point to the read-write switching point.

Example embodiments of the present disclosure provide a memory system capable of permitting the scheduling of bank requests of a next turn from a specific time point to a read-write switching point of this turn.

Example embodiments disclose a memory system comprising a memory device including a memory cell array divided into a plurality of memory banks, and a memory controller configured to send read requests or write requests to the memory device for the purpose of inputting data to or outputting data from the memory banks of the memory cell array, respectively, and to send the read requests so as to be separated from the write requests based on a read-write switching point, wherein the memory controller is configured to in a first turn of input/output (I/O) requests including the read requests or the write requests, set a near switching point before the read-write switching point based on a number of I/O requests processed in the first turn from among the I/O requests, block scheduling at least one of first bank requests, between the near switching point and the read-write switching point for at least one first preliminary I/O request to be scheduled in the first turn, the at least one of the first bank requests indicating state switching of the memory banks, and schedule at least one of second bank requests so as to be issued between the near switching point and the read-write switching point, for the purpose of second preliminary I/O requests to be scheduled in a second turn after the read-write switching point, the at least one of the second bank requests indicating state switching of the memory banks.

Example embodiments disclose a memory system comprising a memory device including a memory cell array divided into a plurality of memory banks; and a memory controller configured to send read requests or write requests to the memory device for the purpose of inputting data to or outputting data from the memory banks of the memory cell array, respectively, and to send the read requests so as to be separated from the write requests based on a read-write switching point, wherein the memory controller is configured to in a first turn of input/output (I/O) requests including the read requests or the write requests, set a near switching point before the read-write switching point based on a number of I/O requests processed in the first turn from among the I/O requests, and block scheduling a first active request between the near switching point and the read-write switching point for at least one preliminary I/O request to be scheduled in the first turn, the first active request indicating to set one of the memory banks to an active state.

Example embodiments disclose an operating method of a memory system, the method comprising in a first turn of input/output (I/O) requests including read requests or write requests transferred to a memory device from a memory controller, setting a read-write switching point based on the max request number of I/O requests to be performed in the first turn or based on a specified time; setting a near switching point before the read-write switching point based on the number of I/O requests processed in the first turn from among the I/O requests; blocking scheduling at least one first bank request between the near switching point and the read-write switching point for at least one first preliminary I/O request to be scheduled in the first turn, the at least one first bank request indicating state switching of memory banks included in the memory device; and scheduling at least one of second bank requests so as to be issued between the near switching point and the read-write switching point, for second preliminary I/O requests to be scheduled in a second turn after the read-write switching point, the at least one of the second bank requests indicating state switching of the memory banks.

BRIEF DESCRIPTION OF THE FIGURES

The above and other objects and features of the present disclosure will become apparent by describing in detail some example embodiments thereof with reference to the accompanying drawings in which:

FIG. 6 is a diagram illustrating another example of a read request queue, a write request queue, read request information, write request information, bank status information of FIG. 2;

DETAILED DESCRIPTION

Below, example embodiments of the present disclosure will be described in detail and clearly to such an extent that an ordinary one in the art easily implements the invention.

Also, below, a dynamic random access memory (DRAM) may be used as an example of a semiconductor memory device for describing features and functions of the invention. However, one skilled in the art may easily understand other merits and performance of the invention based on the content disclosed in the specification. The invention may be implemented or applied through other example embodiments. In addition, the detailed description may be changed or modified based on view points and applications without departing from the claims, the scope and spirit, and any other purposes of the invention.

Figure 1:
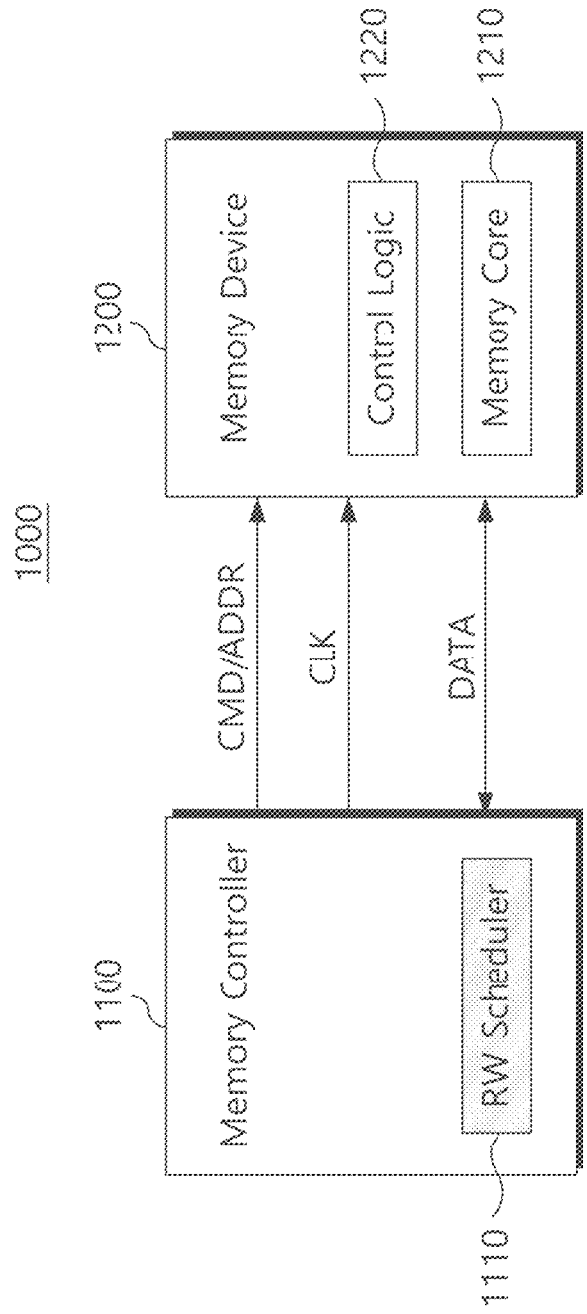
FIG. 1 is a block diagram illustrating a memory system according to some example embodiments.

FIG. 1 is a block diagram illustrating a memory system according to some example embodiments. Referring to FIG. 1, a memory system 1000 of some example embodiments may include a memory controller 1100 and a memory device 1200.

According to some example embodiments, the memory controller 1100 may perform an access operation to write data in the memory device 1200 or to read data stored in the memory device 1200. For example, the memory controller 1100 may generate a command CMD and an address ADDR for writing data in the memory device 1200 or reading data stored in the memory device 1200. The memory controller 1100 may be at least one of a memory controller for controlling the memory device 1200, a system on chip (SoC) such as an application processor (AP), a central processing unit (CPU), a digital signal processor (DSP), and a graphics processing unit (GPU).

According to some example embodiments, the memory controller 1100 may control an overall operation of the memory device 1200 by providing various kinds of signals to the memory device 1200. For example, the memory controller 1100 may control a memory access operation of the memory device 1200, such as a read operation or a write operation. The memory controller 1100 may provide the command CMD and the address ADDR for the purpose of storing data "DATA" in the memory device 1200 or reading the data "DATA" stored in the memory device 1200. Also, the memory controller 1100 may further provide a clock signal CLK to the memory device 1200.

According to some example embodiments, the memory controller 1100 may generate various kinds of commands CMD for controlling the memory device 1200. For example, the memory controller 1100 may generate a bank request corresponding to a bank operation for state switching of memory banks included in a memory core 1210 for the purpose of reading or writing the data "DATA". As an example, the bank request may include an active request for setting the memory banks included in the memory core 1210 to an active state. The memory device 1200 may activate a row included in the memory banks, that is, a word line in response to the active request. The bank request may include a precharge request for switching the state of the memory banks from the active state to a standby state after the data "DATA" are completely read or written. Also, the memory controller 1100 may generate an input/output (I/O) request (e.g., a CAS request) that allows the memory device 1200 performs the read operation or the write operation on the data "DATA". As an example, the I/O request may include a read request for reading the data "DATA" from activated memory banks. The I/O request may include a write request for writing the data "DATA" in activated memory banks. Also, the memory controller 1100 may generate a refresh request for controlling a refresh operation for the memory banks. However, the command kinds described above are provided as an example, and any other kinds of commands CMD may be implemented.

According to some example embodiments, the memory controller 1100 may determine the order of sending commands CMD to the memory device 1200. The memory controller 1100 may include a read-write (RW) scheduler 1110. For example, the read-write scheduler 1110 may determine the order of sending the bank requests (e.g., the active request and the precharge request) and the I/O requests (e.g., the read request and the write request) to the memory device 1200. The bank request may include a bank request corresponding to the read request or a bank request corresponding to the write request. The read-write scheduler 1110 may schedule the read request and the write request so as to be separately transferred. The read-write scheduler 1110 may determine a turn based on a specified unit (e.g., the specified number of requests or a specified time) and may perform scheduling such that a given amount of read requests or write requests are transferred.

According to some example embodiments, the memory device 1200 may output the data "DATA" read-requested by the memory controller 1100 to the memory controller 1100 or may store the data "DATA" write-requested by the memory controller 1100 in memory cells. The memory device 1200 may input/output the data "DATA" based on the command CMD, the address ADDR, and the clock signal CLK. The memory device 1200 may include the memory core 1210 and control logic 1220.

Herein, the memory device 1200 may be a volatile memory device such as a dynamic random access memory (DRAM), a synchronous DRAM (SDRAM), a double data rate (DDR) DRAM, a DDR SDRAM, a low-power double data rate (LPDDR) SDRAM, a graphics double data rate (GDDR) SDRAM, a Rambus DRAM (RDRAM), or a static random access memory (SRAM). Alternatively, the memory device 1200 may be implemented with a non-volatile memory device such as a resistive RAM (RRAM), a phase-change memory (PRAM), a magnetic memory (MRAM), a ferroelectric memory (FRAM), a spin transfer torque memory (STT-RAM). In the specification, the advantages of the invention will be described based on the DRAM, but the example embodiments are not limited thereto.

According to some example embodiments, the memory core 1210 may include a memory cell array divided in units of bank, a row decoder, a column decoder, a sense amplifier, a write driver, etc. The memory core 1210 may store the data "DATA" write-requested with respect to the memory device 1200 through the write driver and may read read-requested data by using the sense amplifier. In addition, components for the refresh operation for storing and retaining data in the memory cell array or address-based select circuits may be further provided. However, because the invention is not directly related to the memory core 1210, the description associated with components of the memory core 1210 will be omitted.

According to some example embodiments, the control logic 1220 may receive control signals, such as the command CMD and the address ADDR, and the clock signal CLK from the memory controller 1100. The control logic 1220 may control the write, read, or and delete (or erase) operation of the memory device 1200 by using the control signals and the clock signal CLK.

According to some example embodiments, the memory device 1200 may control memory banks of the memory core 1210 based on the bank request (e.g., the active request or the precharge request) and the I/O request (e.g., the read request or the write request) received from the memory controller 1100. For example, the memory device 1200 may activate a memory bank and a row that are selected in response to the active request. The memory device 1200 may output (or read) the data "DATA" of the activated memory bank and row in response to the read request. The memory device 1200 may input (or store) the data "DATA" at the activated memory bank and row in response to the write request. The memory device 1200 may set the activated memory bank and row to the standby state (or may switch the state of the activated memory bank and row from the active state to the standby state) in response to the precharge request.

Figure 2:
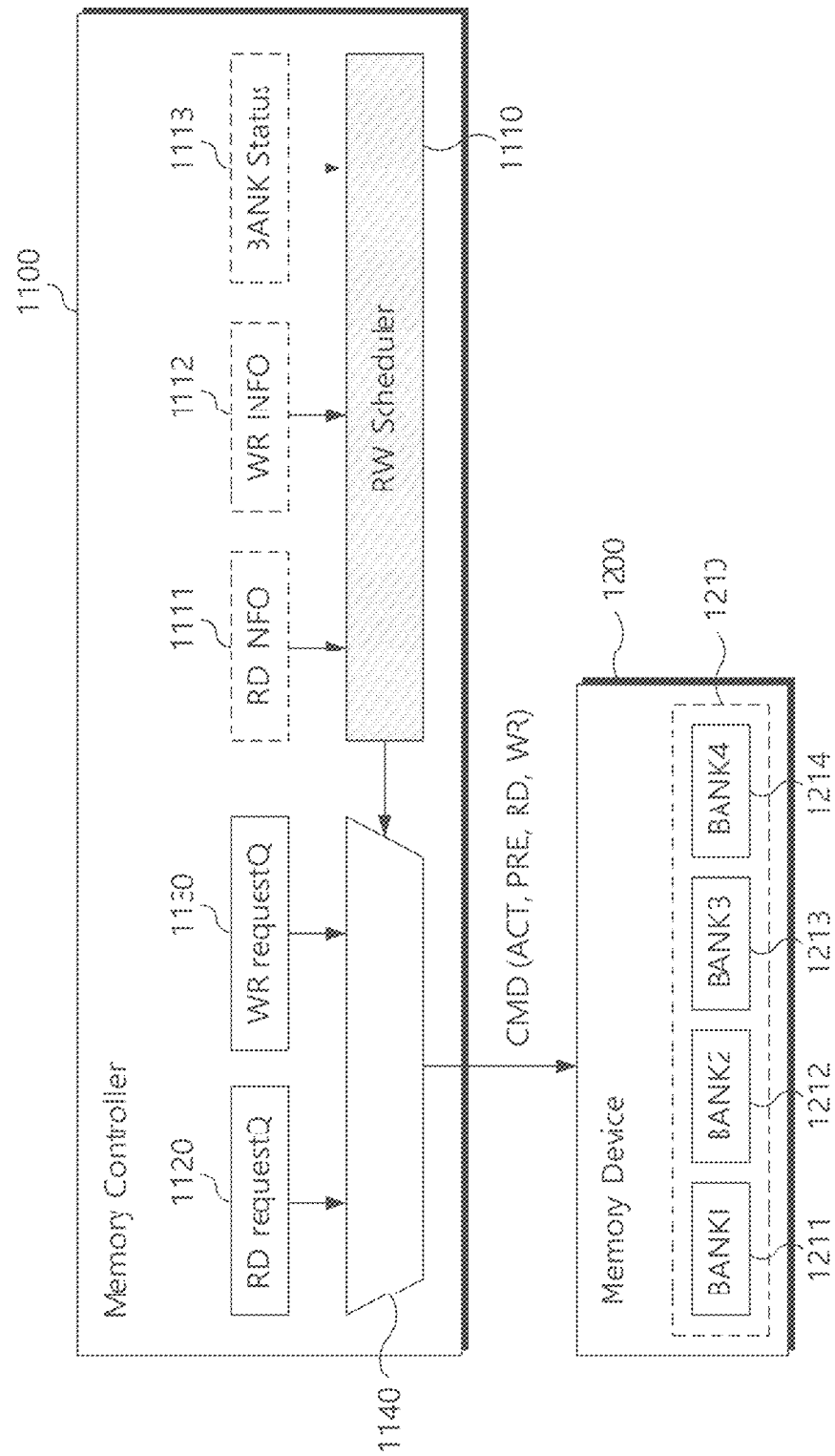
FIG. 2 is a block diagram illustrating a command transfer operation of a memory controller of FIG. 1.

FIG. 2 is a block diagram illustrating a command transfer operation of a memory controller of FIG. 1. Referring to FIG. 2, the memory controller 1100 may include the read-write scheduler 1110, a read request queue (RD requestQ) 1120, a write request queue (WR requestQ) 1130, and an arbitration circuit 1140. The memory device 1200 may include the memory core 1210, and the memory core 1210 may include a plurality of memory banks. As an example, the plurality of memory banks may include a first bank 1211, a second bank 1212, a third bank 1213, and a fourth bank 1214. Below, the description will be given as the memory controller 1100 sends the bank request (e.g., an active request ACT or a precharge request PRE) or the I/O request (e.g., a read request RD or a write request WR) with respect to the first bank 1211, the second bank 1212, the third bank 1213, and the fourth bank 1214. However, this is provided as an example, and the memory device 1200 may include at least one memory bank.

According to some example embodiments, the read-write scheduler 1110 may schedule the bank request or the I/O request to be transferred to the memory device 1200. For example, the read-write scheduler 1110 may obtain read request information (RD INFO) 1111, write request information (WR INFO) 1112, and bank status information (BANK Status) 1113. The read request information 1111 may include information about the read request RD (e.g., a max burst, a current burst, and the number of page-hit requests). The write request information 1112 may include information about the write request WR (e.g., a max burst, a current burst, and the number of page-hit requests). The bank status information 1113 may include information about a currently activated bank. Also, the read-write scheduler 1110 may obtain information about requests currently stored in the read request queue 1120 or the write request queue 1130 and processing information about requests stored in the read request queue 1120 or the write request queue 1130.

According to some example embodiments, the read-write scheduler 1110 may schedule the read request and the write request so as to be separately transferred. For example, the read-write scheduler 1110 may determine a turn based on a specified unit (e.g., the specified number of requests or a specified time) and may perform scheduling such that a given amount of read requests or write request are transferred. As an example, the read-write scheduler 1110 may set a read-write switching point where a turn where read requests are performed and a turn where write requests are performed are switched. The read-write scheduler 1110 may set the read-write switching point based on the number of requests that are performed in the read turn or the write turn. Alternatively, the read-write scheduler 1110 may set the read-write switching point based on a time during which the read turn or the write turn is performed.

According to some example embodiments, the read request queue 1120 may manage information about read requests received from a host (not illustrated). For example, the read request queue 1120 may store the read requests RD. The read request queue 1120 may store the address ADDR (e.g., bank and row addresses) of the read request RD. The read request queue 1120 may store valid information of the read request RD. The read request queue 1120 may selectively output one of the read requests RD. The read request queue 1120 may provide the read-write scheduler 1110 with information about the read request RD capable of being currently transferred. The read request queue 1120 may have a specified size. The read request queue 1120 may store a newly received read request RD in an empty space or may overwrite the newly received read request RD on a previous read request RD processed as invalid.

According to some example embodiments, the write request queue 1130 may manage information about write requests received from the host (not illustrated). For example, the write request queue 1130 may store the write requests WR. The write request queue 1130 may store the address ADDR (e.g., bank and row addresses) of the write request WR. The write request queue 1130 may store valid information of the write request WR. The write request queue 1130 may selectively output one of the write requests WR. The write request queue 1130 may provide the read-write scheduler 1110 with information about the write request WR capable of being currently transferred. The write request queue 1130 may have a specified size. The write request queue 1130 may store a newly received write request WR in an empty space or may overwrite the newly received write request WR on a previous write request WR processed as invalid.

According to some example embodiments, the arbitration circuit 1140 may send the commands CMD to the memory device 1200 under control of the read-write scheduler 1110. For example, the arbitration circuit 1140 may send the active request ACT corresponding to a bank selected in the read turn. The arbitration circuit 1140 may send the read request RD corresponding to the active request ACT. After the read request RD is processed, the arbitration circuit 1140 may send the precharge request PRE corresponding to the bank where the read request RD is processed. Also, the arbitration circuit 1140 may send the active request ACT corresponding to a bank selected in the write turn. The arbitration circuit 1140 may send the write request WR corresponding to the active request ACT. After the write request WR is processed, the arbitration circuit 1140 may send the precharge request PRE corresponding to the bank where the write request WR is processed. The arbitration circuit 1140 may be implemented independently of the read-write scheduler 1110 or may be implemented within the read-write scheduler 1110.

Figure 3:
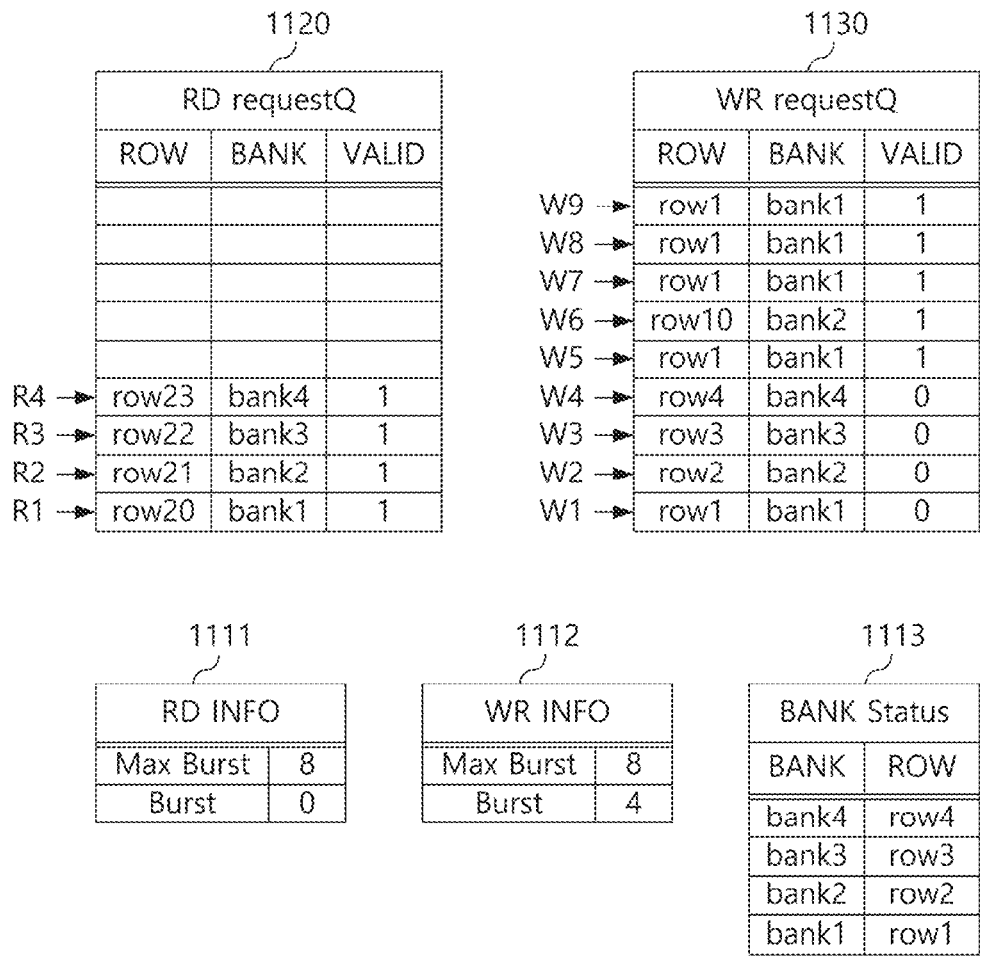
FIG. 3 is a diagram illustrating an example of a read request queue, a write request queue, read request information, write request information, bank status information of FIG. 2.

FIG. 3 is a diagram illustrating an example of a read request queue, a write request queue, read request information, write request information, bank status information of FIG. 2. Referring to FIG. 3, each of the read request queue 1120 and the write request queue 1130 may store 9 requests. However, this is provided as an example, and each of (or alternatively, at least one of) the read request queue 1120 and the write request queue 1130 may store at least one request.

According to some example embodiments, each of (or alternatively, at least one of) the read request queue 1120 and the write request queue 1130 may store requests in the order of receiving the requests. The read request queue 1120 or the write request queue 1130 may include information about the read request RD or the write request WR. The information about the read request RD or the write request WR may include an address (e.g., a bank value BANK and a row value ROW) and valid information VALID corresponding the read request RD or the write request WR. The valid information VALID may indicate whether a corresponding I/O request is processed (or whether the corresponding I/O request is transferred to the memory device 1200). As an example, the valid information VALID corresponding to the processed I/O request may be marked by "0" (e.g., W1, W2, W3, and W4). The valid information VALID of an I/O request that is not yet processed may be marked by "1" (e.g., R1, R2, R3, R4, W5, W6, W7, W8, and W9)

According to some example embodiments, each of (or alternatively, at least one of) the read request information 1111 and the write request information 1112 may include max burst information and burst information. For example, the max burst information may indicate the number of I/O requests scheduled in one turn. The burst information may indicate the number of I/O requests that are completely processed (or the number of I/O requests completely transferred to the memory device 1200).

According to some example embodiments, the bank status information 1113 may indicate active state information of the memory banks 1211, 1212, 1213, and 1214 of the memory device 1200. For example, the bank status information 1113 may include bank information BANK and row information ROW of the active state.

Figure 4:
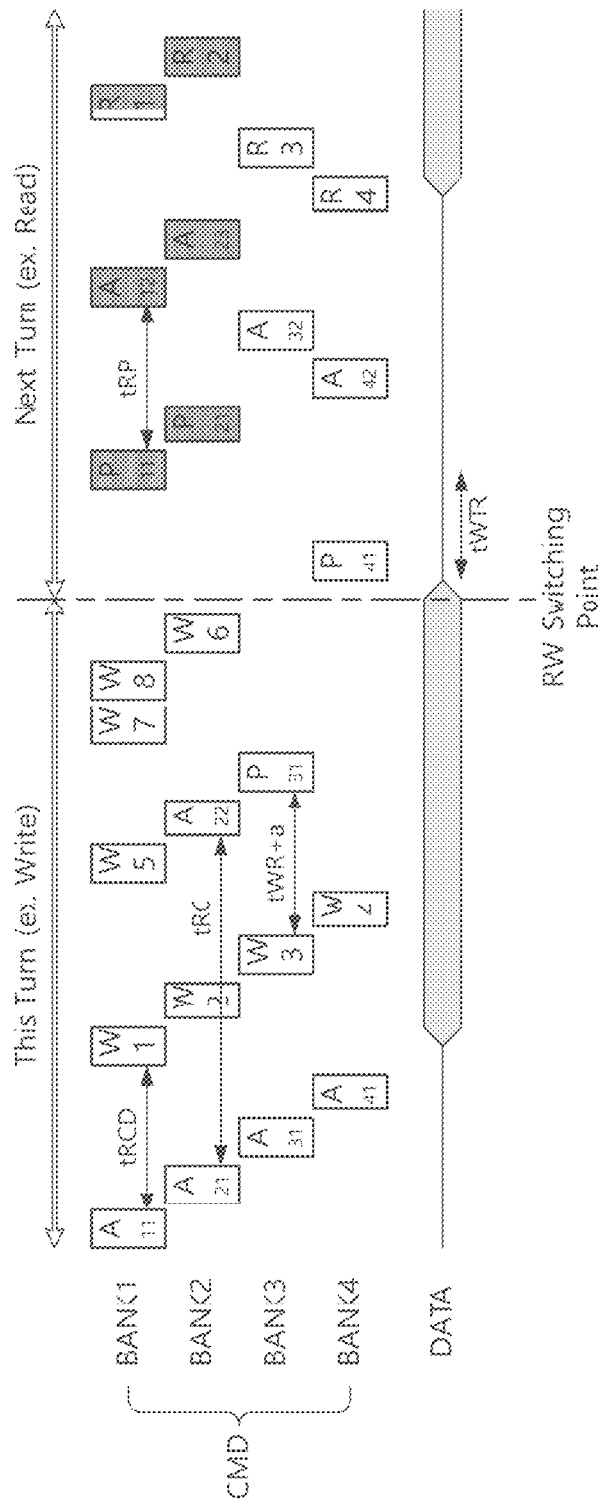
FIG. 4 is a diagram illustrating a method in which a memory controller of FIG. 2 performs read-write scheduling by using information of FIG. 3.

FIG. 4 is a diagram illustrating a method in which a memory controller of FIG. 2 performs read-write scheduling by using information of FIG. 3. Referring to FIGS. 2 to 4, the memory controller 1100 may determine a turn such that the read requests RD and the write requests WR are separately scheduled. An example where this turn (or a current turn) is set to the write turn and a next turn is set to the read turn. However, this is provided as an example, and the read turn and the write turn may be alternately repeated. As an example, when this turn is the write turn, a next turn may be the read turn; when this turn is the read turn, a next turn may be the write turn.

According to some example embodiments, the read-write scheduler 1110 of the memory controller 1100 may check a request queue (e.g., the write request queue 1130) of this turn (e.g., the write turn). For example, at a start time point of the current write turn, a first write request W1 to a sixth write request W6 may be present in the write request queue 1130. As such, the read-write scheduler 1110 may schedule active requests A11, A21, A31, and A41 respectively corresponding to the first write request W1 to the fourth request W4 based on addresses (or bank values and row values), so as to be assigned (or transferred) to the memory banks BANK1, BANK2, BANK3, and BANK4. The active requests A11, A21, A31, and A41 to be assigned (or transferred) to different banks may be scheduled at a first specified time interval being relatively short.

According to some example embodiments, the read-write scheduler 1110 may schedule the first write request W1 to the fourth write request W4 so as to be assigned (or transferred) to the memory banks BANK1, BANK2, BANK3, and BANK4 after a second specified time (e.g., tRCD) longer than the first specified time passes. A time interval is required or desired between the active request and the I/O request as much as the second specified time (tRCD). The first write request W1 to the fourth write request W4 may be scheduled at a third specified time interval shorter than the second specified time interval. I/O requests may be scheduled at a third specified time interval regardless of a specified bank.

According to some example embodiments, the second write request W2 and the sixth write request W6 may be assigned (or allocated) to different rows (e.g., row1 and row10) in the same bank (e.g., bank2), thereby causing a page conflict situation. As such, the read-write scheduler 1110 may schedule an auto precharge command such that the precharge operation is performed immediately after the write operation corresponding to the second write request W2. Accordingly, the active request may be immediately scheduled without the precharge request after the second write request W2.

According to some example embodiments, whenever a request is scheduled, the read-write scheduler 1110 may check a request queue (e.g., the write request queue 1130) of this turn (e.g., the write turn). For example, after the fourth write request W4 is scheduled, when the read-write scheduler 1110 checks the write request queue 1130, a seventh write request W7 to a ninth write request W9 may be further present in the write request queue 1130. The read-write scheduler 1110 may perform scheduling based on addresses of the fifth write request W5 to the ninth write request W9.

According to some example embodiments, the read-write scheduler 1110 may set a read-write (RW) switching point based on request information (e.g., the read request information 1111 or the write request information 1112) of this turn (i.e., the write turn). For example, because the max burst information included in the write request information 1112 has a value of "8", the read-write scheduler 1110 may schedule a next turn (e.g., the read turn) after the scheduling of the fifth write request W5 to the eighth write request W8. As an example, because the fifth write request W5, the seventh write request W7, and the eighth write request W8 are in a state of being page-hit on the first write request W1 (e.g., the page-hit meaning that I/O requests have the same bank value and the same row value), the fifth write request W5, the seventh write request W7, and the eighth write request W8 may be scheduled to be assigned (or transferred) to the first bank BANK1 of the active state without an additional bank request.

According to some example embodiments, the read-write scheduler 1110 may schedule the active request A22 corresponding to the sixth write request W6 so as to be assigned (or transferred) to the second bank BANK2. Because the bank value of the sixth write request W6 is equal to the bank value as the second write request W2 but the row value of the sixth write request W6 is different from the row value as the second write request W2, it is necessary to precharge a memory bank and to then again activate the memory bank. However, because the auto precharge command is transferred with regard to the second write request W2, the read-write scheduler 1110 may schedule the active request A22 after the second write request W2 without the precharge request. Meanwhile, a fourth specified time (e.g., tRC) longer than the second specified time (e.g., tRCD) is required or desired between two active requests scheduled to be assigned (or transferred) to the same bank. The read-write scheduler 1110 may schedule the active request A22 after the fourth specified time (e.g., tRC) from the active request A21.

According to some example embodiments, because a request associated with the third bank BANK3 is absent from the fifth write request W5 to the eighth write request W8, the read-write scheduler 1110 may schedule the precharge request P31 to be assigned (or transferred) to the third bank BANK3. A time (e.g., tWR) necessary to process a write request and an addition time "a" may be required or desired between the write request and the precharge request.

According to some example embodiments, the read-write scheduler 1110 may schedule a next turn (e.g., the read turn) after the read-write switching point. The read-write scheduler 1110 may check a request queue (e.g., e.g., the read request queue 1120) of a next turn (e.g., the read turn). For example, at the read-write switching point, a first read request R1 to a fourth read request R4 may be present in the read request queue 1120. To schedule the first read request R1 to the fourth read request R4, the read-write scheduler 1110 may check active states of the memory banks BANK1, BANK2, BANK3, and BANK4 through the bank status information 1113. Also, the read-write scheduler 1110 may check the scheduling status of this turn (e.g., the write turn) through the write request queue 1130.

According to some example embodiments, the read-write scheduler 1110 may schedule the first read request R1 to the fourth read request R4 based on a state of each memory bank and a time necessary between requests. As an example, the read-write scheduler 1110 may schedule precharge requests P11, P21, and P41 corresponding to the first read request R1, the second read request R2, and the fourth read request R4. Because the third bank BANK3 is already precharged in this turn (e.g., the write turn) (e.g., P31), the third bank BANK3 may not require the precharge request in a next turn (e.g., the read turn). The read-write scheduler 1110 may schedule the precharge requests P11, P21, and P41 in consideration of a time interval necessary after the scheduling of this turn (e.g., the write turn). After the precharge requests P11, P21, and P41 are scheduled, the read-write scheduler 1110 may schedule active requests A12, A23, A32, and A42 corresponding to the first read request R1 to the fourth read request R4. A fifth specified time tRP may be required or desired between the precharge request and the active request. After the active requests A12, A23, A32, and A42 are scheduled, the read-write scheduler 1110 may schedule the first read request R1 to the fourth read request R4.

As described above, the memory controller 1100 may schedule read requests and write requests such that a specified number of read requests (or read requests belonging to the specified time) and a specified number of write requests (or write requests belonging to a specified time) are separated based on the read-write switching point and may then send the read requests and the write requests to the memory device 1200. The reason is that a time necessary between homogeneous requests (e.g., between read requests or between write requests) is shorter than a time necessary between heterogeneous requests (e.g., between a read request and a write request). The memory controller 1100 may shorten an operating time by grouping and processing homogeneous requests in one turn. However, in the case of setting a read-write switching point and grouping and processing homogeneous requests, a blank time (or a time gap) may be present between the last I/O request (e.g., the sixth write request W6) of this turn and the first I/O request (e.g., the fourth read request R4) of a next turn. The blank time (or time gap) may be longer than a minimum required or desired time tWTR necessary for the read operation after the write operation (or the write operation after the read operation).

Figure 5:
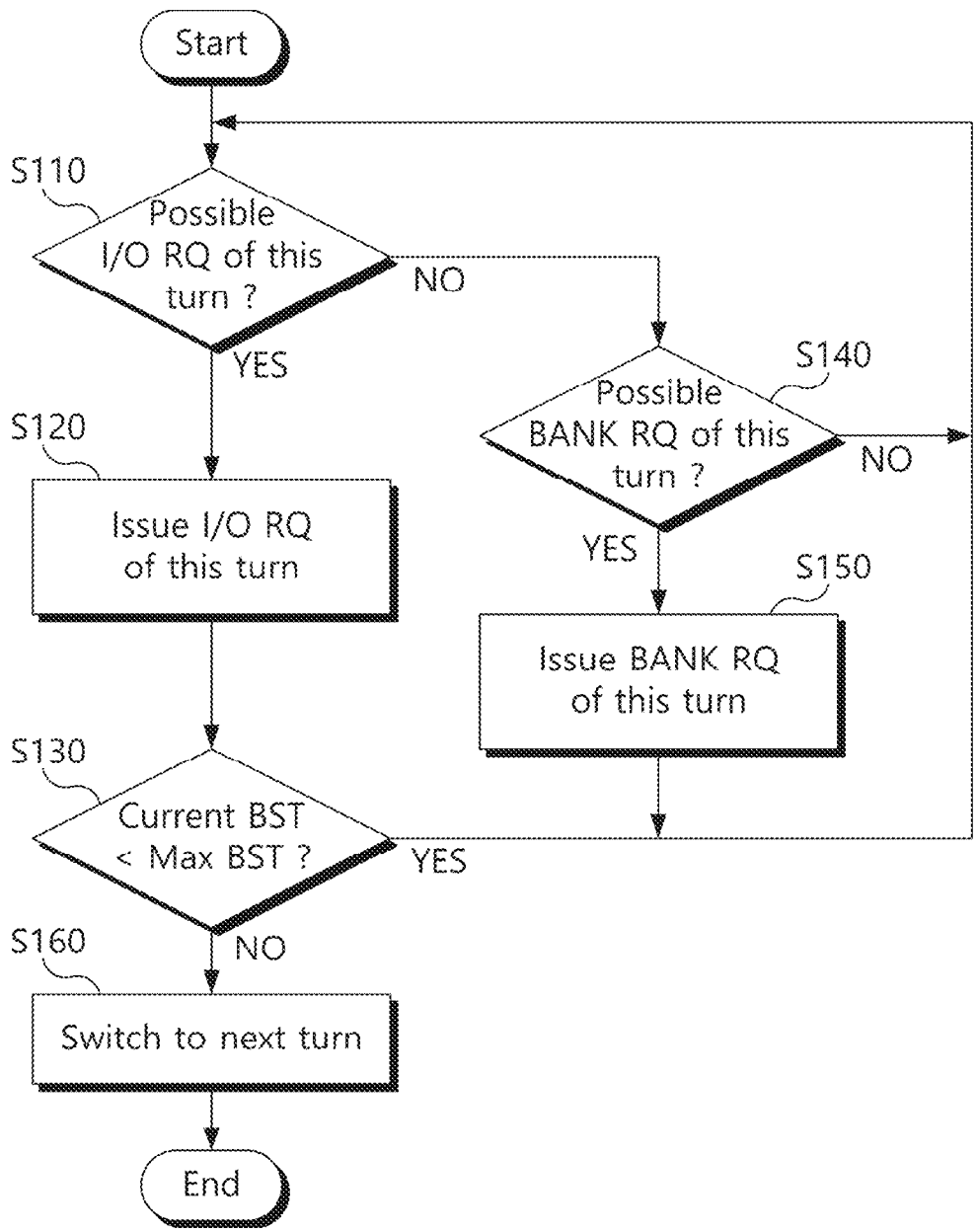
FIG. 5 is a flowchart illustrating a read-write scheduling method of FIG. 4.

FIG. 5 is a flowchart illustrating a read-write scheduling method of FIG. 4. Referring to FIGS. 2 to 5, the memory controller 1100 may separate this turn (e.g., the write turn) and a next turn (e.g., the read turn) based on a read-write switching point to schedule I/O requests (e.g., read requests or write requests).

According to some example embodiments, in operation S110, the memory controller 1100 may determine whether there is a possible I/O request (RQ) of this turn. When it is determined that there is a possible I/O request of this turn, the memory controller 1100 may perform operation S120. When it is determined that there is no possible I/O request of this turn, the memory controller 1100 may perform operation S140. For example, the memory controller 1100 may check information about I/O requests of this turn through the read request queue 1120 or the write request queue 1130. The case where the I/O request is impossible may include the case where a memory bank corresponding to the I/O request is in an inactive state or the case where the memory bank is in the active state but row values are different. The read request 1120 queue includes bank information BANK and row information ROW corresponding to each of the read requests and includes valid information indicating whether the read requests are processed, and the write request queue includes bank information BANK and row information ROW corresponding to each of the write requests. In response to one of the read requests or the write requests being transferred to the memory device by the arbitration circuit, the read-write scheduler is configured to update the bank information, the row information, and the valid information of the read request queue or the write request queue and determine the near switching point based on the updated row information, and the updated valid information of the read request queue or the write request queue.

According to some example embodiments, when there is a possible I/O request of this turn, in operation S120, the memory controller 1100 may schedule a selected I/O request in this turn.

According to some example embodiments, in operation S130, the memory controller 1100 may compare max burst information and current burst information. When a current burst value is smaller than a max burst value, the memory controller 1100 may again perform operation S110. When the current burst value is greater than or equal to the max burst value, the memory controller 1100 may perform operation S160.

According to some example embodiments, when there is no possible I/O request of this turn, in operation S140, the memory controller 1100 may determine whether there is a possible bank request (e.g., an active request or a precharge request) of this turn. When it is determined that is a possible bank request (BANK RQ) of this turn, the memory controller 1100 may perform operation S150. When it is determined that there is no possible bank request of this turn, the memory controller 1100 may again perform operation S110.

According to some example embodiments, when there is a possible bank request of this turn, in operation S150, the memory controller 1100 may schedule a selected bank request in this turn. After scheduling the selected bank request, the memory controller 1100 may again perform operation S110.

According to some example embodiments, when the current burst value is greater than or equal to the max burst (MAX BST) value, in operation S160, the memory controller 1100 may terminate this turn and may switch to a next turn. For example, when this turn is the read turn, a next turn may be the write turn. When this turn is the write turn, a next turn may be the read turn. In operation S130, that is, in the process of comparing the current burst value and the max burst value, the memory controller 1100 may set a read-write switching point based on the max burst value.

FIG. 6 is a diagram illustrating another example of a read request queue, a write request queue, read request information, write request information, bank status information of FIG. 2. Referring to FIGS. 2, 3, and 6, the read request queue 1120, the write request queue 1130, the read request information 1111, the write request information 1112, and the bank status information 1113 of FIG. 6 may be mostly identical to the read request queue 1120, the write request queue 1130, the read request information 1111, the write request information 1112, and the bank status information 1113 of FIG. 3. The description that is identical to that given with reference to the read request information 1111, the write request information 1112, and the bank status information 1113 of FIG. 3 will be omitted.

According to some example embodiments, each of (or alternatively, at least one of) the read request information 1111 and the write request information 1112 may include page-hit information. For example, the page-hit means that I/O requests have the same bank value and the same row value. The page-hit information may indicate the number of I/O requests, which have the same bank value and the same row value, from among I/O requests that are not yet processed (or are not transferred to the memory device 1200). As an example, in the write request queue 1130, the fifth write request W5 and the seventh write request W7 to the ninth write request W9, which have the same bank value (e.g., bank1) and the same row value (e.g., row1), from among the fifth write request W5 to the ninth write request W9 that are not currently processed are page-hit I/O requests. Also, the page-hit information may have a value of "4".

Figure 7:
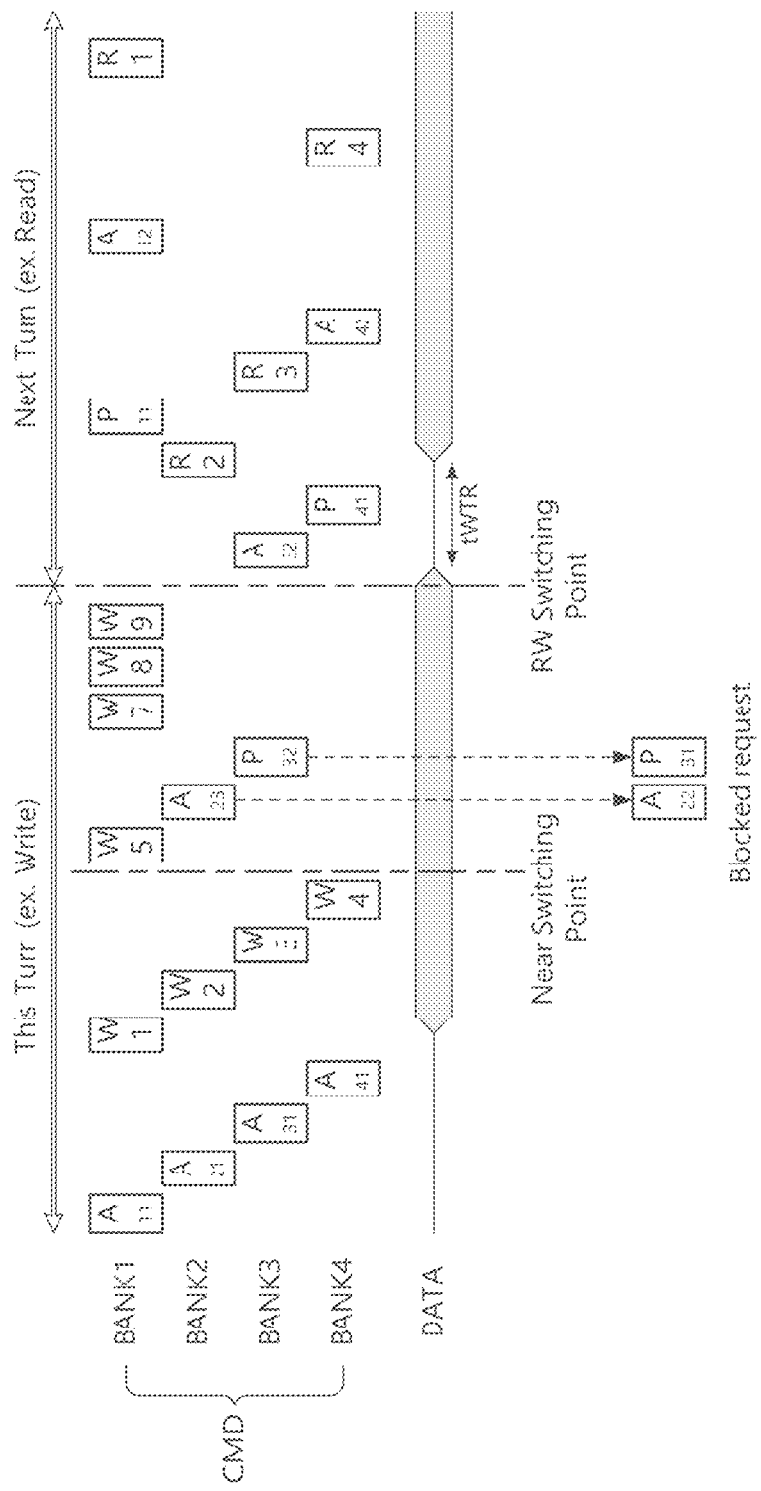
FIG. 7 is a diagram illustrating an example of a method in which a memory controller of FIG. 2 performs read-write scheduling by using information of FIG. 6.

FIG. 7 is a diagram illustrating an example of a method in which a memory controller of FIG. 2 performs read-write scheduling by using information of FIG. 6. Referring to FIGS. 2, 6, and 7, the memory controller 1100 may determine a turn such that the read requests RD and the write requests WR are separately scheduled. The memory controller 1100 may switch from this turn (e.g., the write turn) to a next turn (e.g., the read turn) based on a read-write switching point and may perform scheduling. Also, the memory controller 1100 may set a near switching point.

According to some example embodiments, the memory controller 1100 may set the near switching point in this turn before the read-write switching point. For example, the memory controller 1100 may set the near switching point based on the number of I/O requests processed in this turn. The memory controller 1100 may check request information (e.g., the write request information 1112) of this turn (e.g., the write turn). The memory controller 1100 may check the number (e.g., 4) of page-hit I/O requests of this turn. The memory controller 1100 may check a burst difference value (e.g., 8-4=4) of the max burst value (e.g., 8) and the current burst value (e.g., 4). The memory controller 1100 may compare the burst difference value and the number of page-hit I/O requests. When the number of page-hit I/O requests is smaller than the burst difference value, the memory controller 1100 may continue to perform scheduling of this turn. When the number of page-hit I/O requests is greater than or equal to the burst difference value, the memory controller 1100 may set the near switching point after the last request (e.g., the fourth write request W4) among I/O requests processed up to now.

According to some example embodiments, between the near switching point and the read-write switching point, the memory controller 1100 may block the scheduling of a bank request (e.g., the active request A22 and the precharge request P31) of this turn. The memory controller 1100 may block the scheduling of an I/O request (e.g., the sixth write request W6) corresponding to the blocked bank request. The memory controller 1100 may schedule page-hit I/O requests (e.g., the fifth write request W5 and the seventh write request W7 to the ninth write request W9), which are not yet processed, in this turn.

According to some example embodiments, the memory controller 1100 may schedule a bank request (e.g., the active request A23 and a precharge request P32) of a next turn (e.g., the read turn), which is associated with a memory bank (e.g., the second bank BANK2 or the third bank BANK3) corresponding to the blocked bank request of this turn, so as not to be performed (or issued) in this turn. As such, an I/O request (e.g., the second read request R2 and the third read request R3) corresponding to the bank request of a next turn, which is scheduled to be performed (or issued) in this turn, may be scheduled in a next turn earlier than when the scheduling is made based on the method of FIG. 4. As an example, the second read request R2 may be scheduled immediately after the minimum required or desired time tWTR necessary for the read operation after the write operation (or the write operation after the read operation) passes.

As described above, the memory controller 1100 may set the near switching point before the read-write switching point and may block the scheduling of unnecessary bank requests between the near switching point and the read-write switching point. As such, unnecessary power consumption of the memory controller 1100 may be reduced. Also, the memory controller 1100 may schedule a bank request of a next turn so as to be placed between the near switching point of this turn and the read-write switching point. As such, compared to the case of FIG. 4, a data blank time before and after the read-write switching point may decrease to be close to the minimum required or desired time tWTR necessary for the read operation after the write operation (or the write operation after the read operation). Accordingly, the latency that is necessary for read-write switching may decrease. This may mean that the performance of the memory system 1000 is improved.

Figure 8:
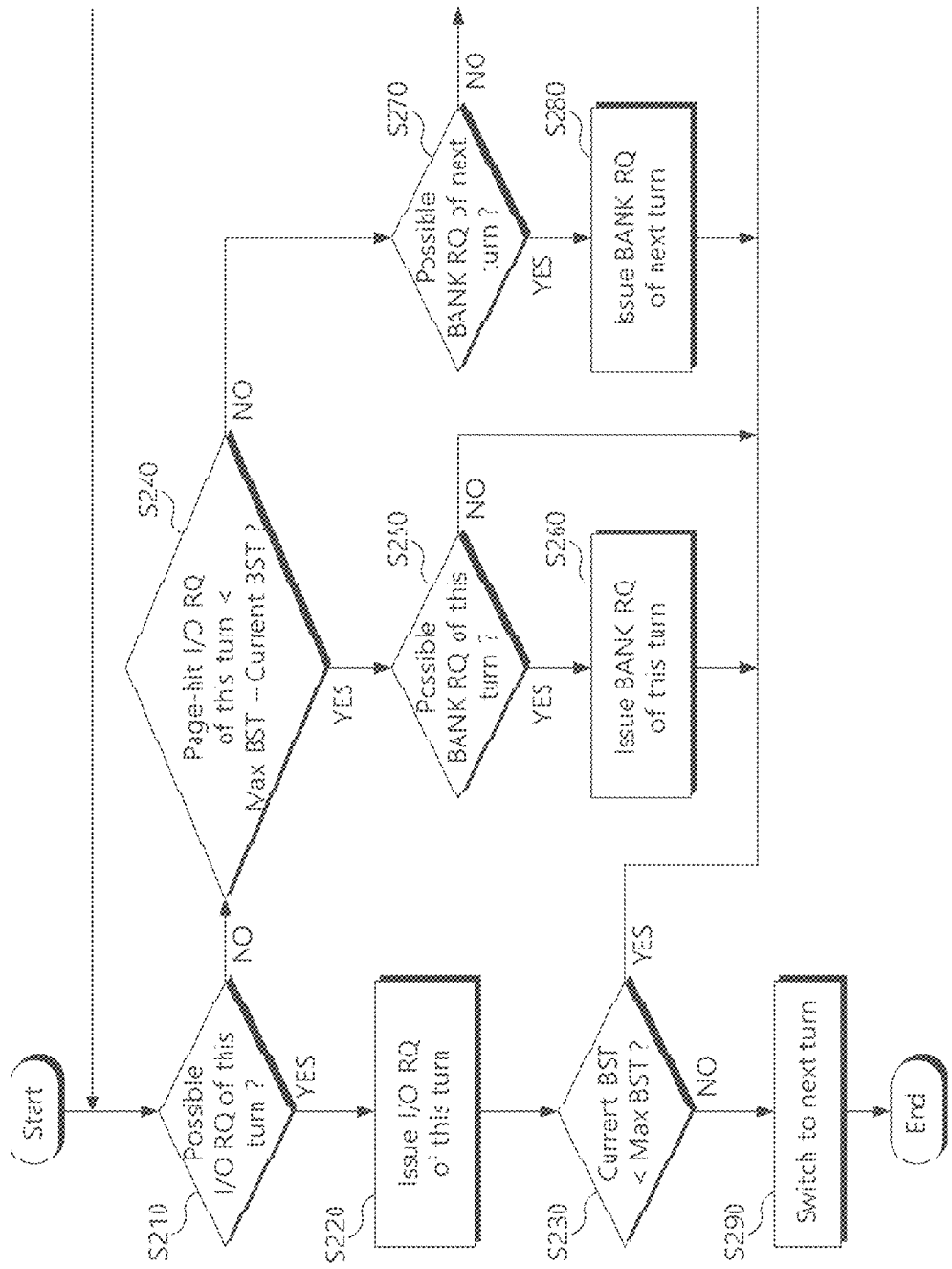
FIG. 8 is a flowchart illustrating a read-write scheduling method of FIG. 7.

FIG. 8 is a flowchart illustrating a read-write scheduling method of FIG. 7. Referring to FIGS. 2 and 6 to 8, the memory controller 1100 may separate this turn (e.g., the write turn) and a next turn (e.g., the read turn) based on a read-write switching point to schedule I/O requests (e.g., read requests or write requests). Also, the memory controller 1100 may set a near switching point and may efficiently manage a bank request between the near switching point and the read-write switching point.

According to some example embodiments, in operation S210, the memory controller 1100 may determine whether there is a possible I/O request of this turn. When it is determined that there is a possible I/O request of this turn, the memory controller 1100 may perform operation S220. When it is determined that there is no possible I/O request of this turn, the memory controller 1100 may perform operation S240. For example, the memory controller 1100 may check information about I/O requests of this turn through the read request queue 1120 or the write request queue 1130. The case where the I/O request is impossible may include the case where a memory bank corresponding to the I/O request is in an inactive state or the case where the memory bank is in the active state but row values are different.

According to some example embodiments, when there is a possible I/O request of this turn, in operation S220, the memory controller 1100 may schedule a selected I/O request in this turn.

According to some example embodiments, in operation S230, the memory controller 1100 may compare max burst information and current burst information. When a current burst value is smaller than a max burst value, the memory controller 1100 may again perform operation S210. When the current burst value is greater than or equal to the max burst value, the memory controller 1100 may perform operation S290.

According to some example embodiments, in operation S240, the memory controller 1100 may check the number (e.g., 4) of page-hit I/O requests of this turn. The memory controller 1100 may check a burst difference value (e.g., 8-4=4) of the max burst value (e.g., 8) and the current burst value (e.g., 4). The memory controller 1100 may compare the burst difference value and the number of page-hit I/O requests. When the number of page-hit I/O requests is smaller than the burst difference value, the memory controller 1100 may perform operation S250. When the number of page-hit I/O requests is greater than or equal to the burst difference value, the memory controller 1100 may perform operation S270.

According to some example embodiments, when the number of page-hit I/O requests is smaller than the burst difference value, in operation S250, the memory controller 1100 may determine whether there is a possible bank request (e.g., an active request and a precharge request) of this turn. Because it is determined that there is a possible bank request of this turn, the memory controller 1100 may perform operation S260. When it is determined that there is no possible bank request of this turn, the memory controller 1100 may again perform operation S210.

According to some example embodiments, when there is a possible bank request of this turn, in operation S260, the memory controller 1100 may schedule a selected bank request in this turn. After scheduling the selected bank request, the memory controller 1100 may again perform operation S210.

According to some example embodiments, when the number of page-hit I/O requests is greater than or equal to the burst difference value, in operation S270, the memory controller 1100 may determine whether there is a possible bank request (e.g., the active request A23 and the precharge request P32) of a next turn. For example, the memory controller 1100 may set the near switching point at a time when it is determined that the number of page-hit I/O requests is greater than or equal to the burst difference value. The memory controller 1100 may schedule the bank request of a next turn after the near switching point without scheduling a bank request (e.g., the active request A22 and the precharge request P31) of this turn. When it is determined that there is a possible bank request of a next turn, the memory controller 1100 may perform operation S280. When it is determined that there is no possible bank request of a next turn, the memory controller 1100 may again perform operation S210.

According to some example embodiments, when there is a possible bank request of a next turn, in operation S280, the memory controller 1100 may schedule a selected bank request (e.g., the active request A23 and the precharge request P32) of a next turn so as to be processed (or issued) in this turn. After scheduling the selected bank request of a next turn so as to be processed (or issued) in this turn, the memory controller 1100 may again perform operation S210.

According to some example embodiments, when the current burst value is greater than or equal to the max burst value, in operation S290, the memory controller 1100 may terminate this turn and may switch to a next turn. For example, when this turn is the read turn, a next turn may be the write turn. When this turn is the write turn, a next turn may be the read turn.

As described above, in operation S230, that is, in the process of comparing the current burst value and the max burst value, the memory controller 1100 may set the read-write switching point based on the max burst value. Also, in operation S240, that is, in the process of comparing the number of page-hit I/O requests with the burst difference value, the memory controller 1100 may set the near switching point.

Figure 9:
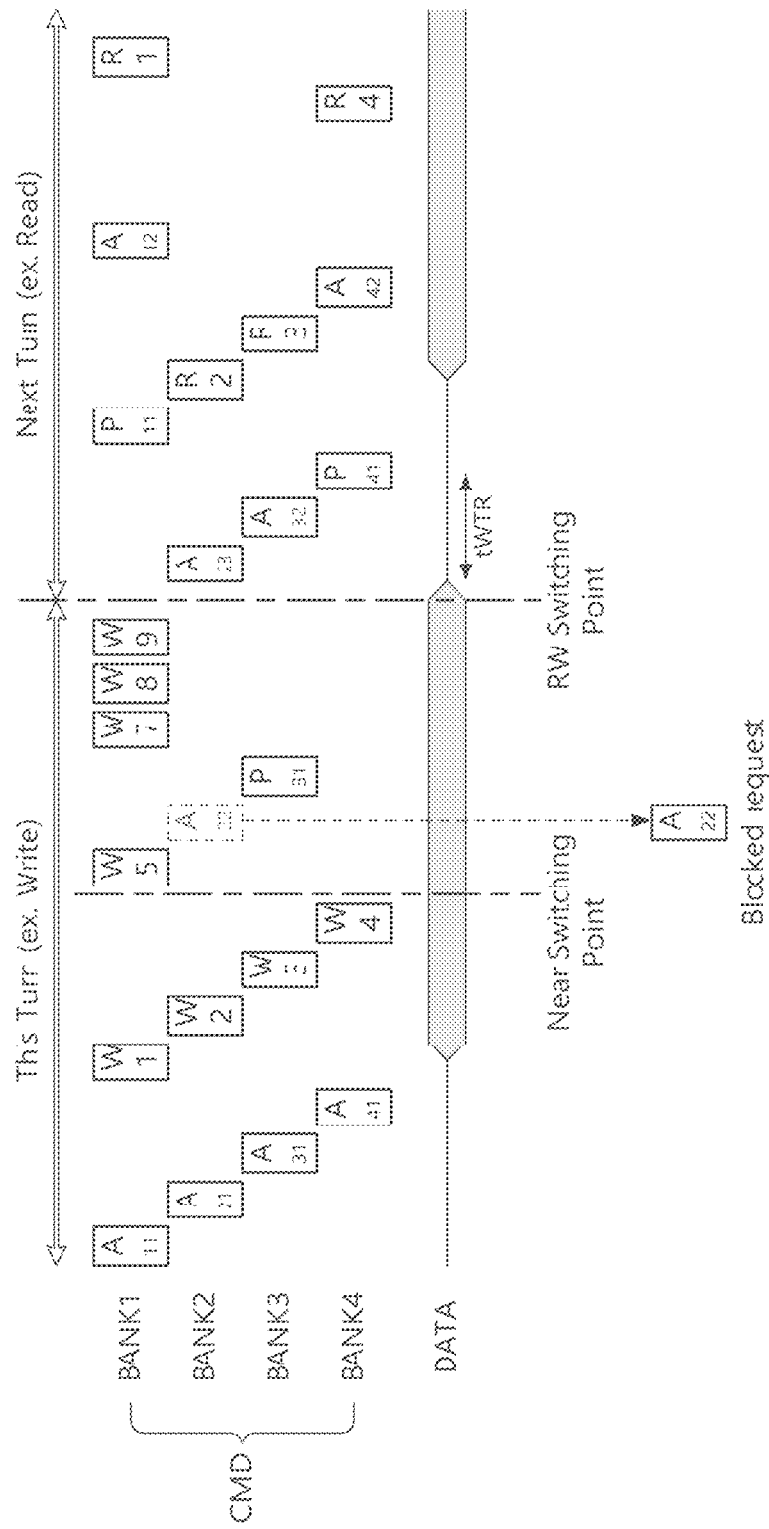
FIG. 9 is a diagram illustrating another example of a method in which a memory controller of FIG. 2 performs read-write scheduling by using information of FIG. 6.

FIG. 9 is a diagram illustrating another example of a method in which a memory controller of FIG. 2 performs read-write scheduling by using information of FIG. 6. Referring to FIGS. 2, 6, and 9, the memory controller 1100 may determine a turn such that the read requests RD and the write requests WR are separately scheduled. The memory controller 1100 may switch from this turn (e.g., the write turn) to a next turn (e.g., the read turn) based on a read-write switching point and may perform scheduling. Also, the memory controller 1100 may set a near switching point.

According to some example embodiments, between the near switching point and the read-write switching point, the memory controller 1100 may block the scheduling of an active request (e.g., the active request A22) of this turn. The memory controller 1100 may block the scheduling of an I/O request (e.g., the sixth write request W6) corresponding to the blocked active request. The memory controller 1100 may schedule page-hit I/O requests (e.g., the fifth write request W5 and the seventh write request W7 to the ninth write request W9), which are not yet processed, in this turn.

According to some example embodiments, when the active request of this turn is blocked, the memory controller 1100 may quickly schedule a bank request (e.g., the active request A23) that belongs to a next turn and is associated with a memory bank corresponding to the blocked bank request of this turn (e.g., the write turn). As such, an I/O request (e.g., the second read request R2) of a next turn, which is associated with the memory bank (e.g., the second bank BANK2) corresponding to the blocked bank request of this turn (e.g., the write turn), may be scheduled in a next turn earlier than when the scheduling is made based on the method of FIG. 4.

As described above, the memory controller 1100 may set the near switching point before the read-write switching point and may block the scheduling of unnecessary active requests between the near switching point and the read-write switching point. As such, unnecessary power consumption of the memory controller 1100 may be reduced. Also, the memory controller 1100 may quickly schedule a bank request of a next turn, which is associated with a memory bank corresponding to a blocked active request. As such, a data blank time before and after the read-write switching point may decrease compared to the case of FIG. 4. Accordingly, the latency that is necessary for read-write switching may decrease. This may mean that the performance of the memory system 1000 is improved.

Figure 10:
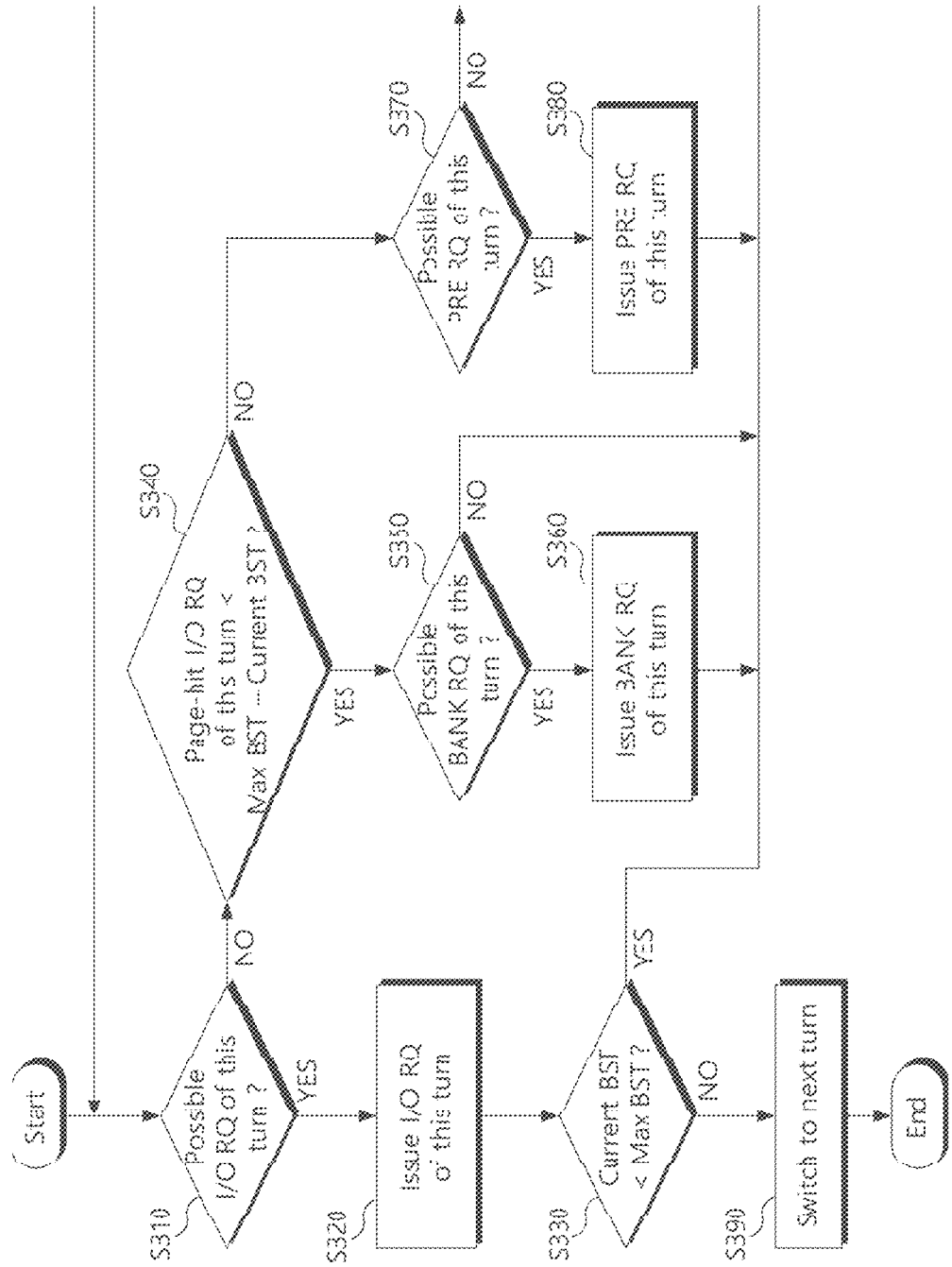
FIG. 10 is a flowchart illustrating a read-write scheduling method of FIG. 9.

FIG. 10 is a flowchart illustrating a read-write scheduling method of FIG. 9. Referring to FIGS. 2, 6, 9, and 10, the memory controller 1100 may separate this turn (e.g., the write turn) and a next turn (e.g., the read turn) based on a read-write switching point to schedule I/O requests (e.g., read requests or write requests). Also, the memory controller 1100 may set a near switching point and may efficiently manage a bank request between the near switching point and the read-write switching point. Operation S310 to operation S360 may be identical or similar to operation S210 to operation S260 of FIG. 8. Also, operation S390 may be identical or similar to operation S290 of FIG. 8. Thus, additional description associated with operation S310 to operation S360 and operation S390 will be omitted to avoid redundancy.

According to some example embodiments, when the number of page-hit I/O requests is greater than or equal to the burst difference value, in operation S370, the memory controller 1100 may determine whether there is a possible precharge request (e.g., the precharge request P31) of this turn. For example, the memory controller 1100 may set the near switching point at a time when it is determined that the number of page-hit I/O requests is greater than or equal to the burst difference value. The memory controller 1100 may not schedule an active request (e.g., the active request A22) of this turn after the near switching point and may schedule only the precharge request (e.g., the precharge request P31) belonging to a bank request in this turn. When it is determined that there is a possible precharge request of this turn, the memory controller 1100 may perform operation S380. When it is determined that there is no possible precharge request of this turn, the memory controller 1100 may again perform operation S310.

According to some example embodiments, when there is a possible precharge request of this turn, in operation S380, the memory controller 1100 may schedule the precharge request (e.g., the precharge request P31) so as to be processed (or issued) in this turn. After scheduling the selected precharge request so as to be processed (or issued) in this turn, the memory controller 1100 may again perform operation S310.

As described above, between the near switching point and the read-write switching point, the memory controller 1100 may block the scheduling of an active request. As such, unnecessary power consumption of the memory controller 1100 may be reduced. Also, the memory controller 1100 may quickly schedule a bank request of a next turn, which is associated with a memory bank corresponding to a blocked active request. As such, a data blank time before and after the read-write switching point may decrease compared to the case of FIG. 4. Meanwhile, the method of FIG. 8 may be more advantageous than the method of FIG. 10 in terms of performance improvement, but the method of FIG. 10 may be more advantageous than the method of FIG. 8 in terms of power efficiency.

Figure 11:
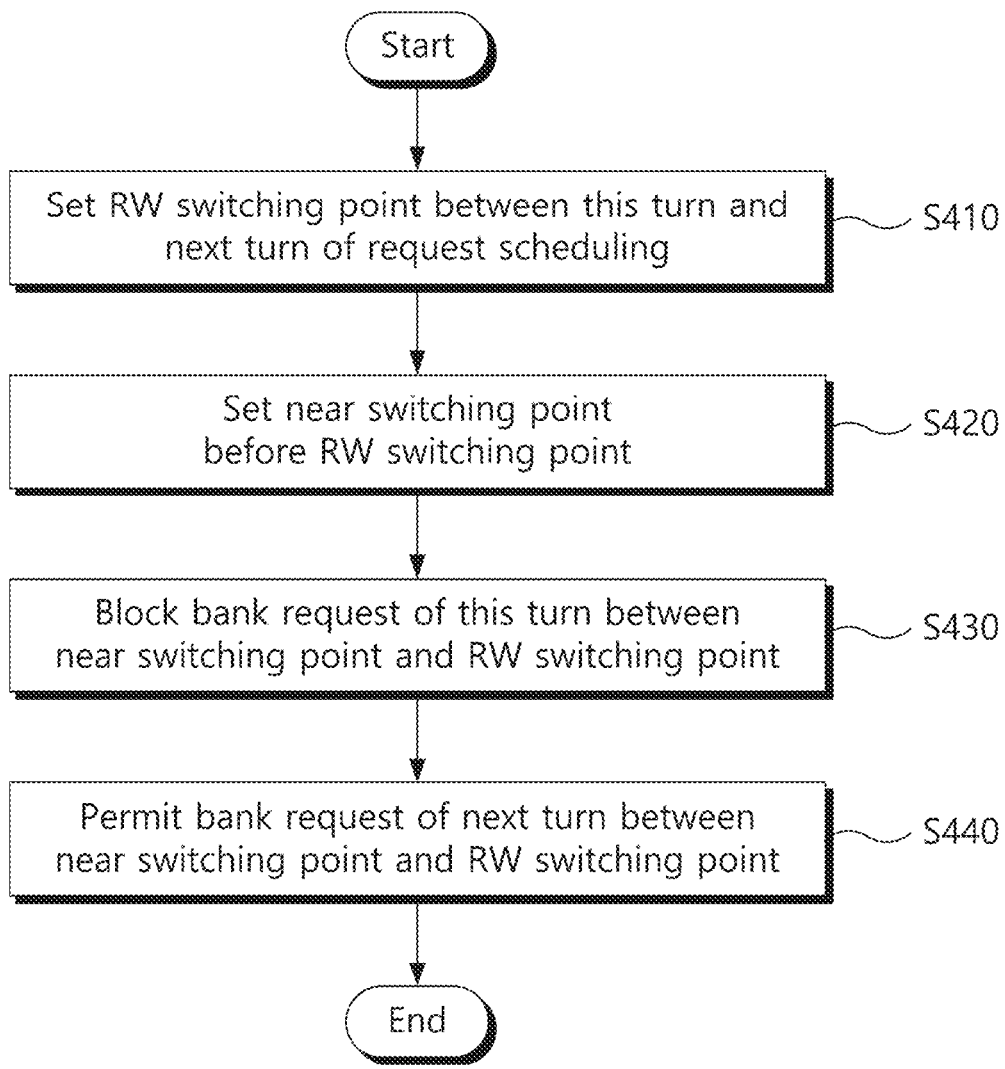
FIG. 11 is a flowchart illustrating a read-write scheduling method of a memory controller of FIG. 2.

FIG. 11 is a flowchart illustrating a read-write scheduling method of a memory controller of FIG. 2. Referring to FIGS. 2 and 6 to 11, the memory controller 1100 may separate this turn (e.g., the write turn) and a next turn (e.g., the read turn) based on a read-write switching point to schedule I/O requests (e.g., read requests or write requests). Also, the memory controller 1100 may set a near switching point and may efficiently manage a bank request between the near switching point and the read-write switching point.

According to some example embodiments, in operation S410, the memory controller 1100 may set the read-write switching point where the switching from this turn to a next turn is made and may schedule I/O requests and bank requests corresponding to the I/O requests. For example, the memory controller 1100 may determine a turn based on a specified unit (e.g., the specified number of requests or a specified time) and may perform scheduling such that a given amount of read requests or write request are transferred. The memory controller 1100 may set the read-write switching point based on the number of requests that are performed in the read turn or the write turn. Alternatively, the memory controller 1100 may set the read-write switching point based on a time during which the read turn or the write turn is performed.

According to some example embodiments, in operation S420 the memory controller 1100 may set the near switching point before the read-write switching point. For example, the memory controller 1100 may set the near switching point based on the number of I/O requests processed in this turn. The memory controller 1100 may check request information (e.g., the write request information 1112) of this turn (e.g., the write turn). The memory controller 1100 may check the number (e.g., 4) of page-hit I/O requests of this turn. The memory controller 1100 may check a burst difference value (e.g., 8-4=4) of the max burst (e.g., 8) and the current burst (e.g., 4). The memory controller 1100 may compare the burst difference value and the number of page-hit I/O requests. When the number of page-hit I/O requests is smaller than the burst difference value, the memory controller 1100 may continue to perform scheduling of this turn. When the number of page-hit I/O requests is greater than or equal to the burst difference value, the memory controller 1100 may set the near switching point after the last request (e.g., the fourth write request W4) among I/O requests processed up to now.

According to some example embodiments, in operation S430, between the near switching point and the read-write switching point, the memory controller 1100 may block the scheduling of a bank request of this turn. For example, referring to FIG. 7, the memory controller 1100 may block the scheduling of a bank request (e.g., the active request A22 and the precharge request P31) of this turn. The memory controller 1100 may block the scheduling of an I/O request (e.g., the sixth write request W6) corresponding to the blocked bank request. The memory controller 1100 may schedule page-hit I/O requests (e.g., the fifth write request W5 and the seventh write request W7 to the ninth write request W9), which are not yet processed, in this turn.

According to some example embodiments, in operation S440, between the near switching point and the read-write switching point, the memory controller 1100 may permit the scheduling of a bank request of a next turn. For example, referring to FIG. 7, the memory controller 1100 may schedule a bank request (e.g., the active request A23 and the precharge request P32) of a next turn (e.g., the read turn), which is associated with a memory bank (e.g., the second bank BANK2 or the third bank BANK3) corresponding to the blocked bank request of this turn, so as to be performed (or issued) in this turn. As such, an I/O request corresponding to the bank request of a next turn, which is scheduled to be performed (or issued) in this turn, may be scheduled in a next turn earlier than when the scheduling is made based on the method of FIG. 4.

Figure 12:
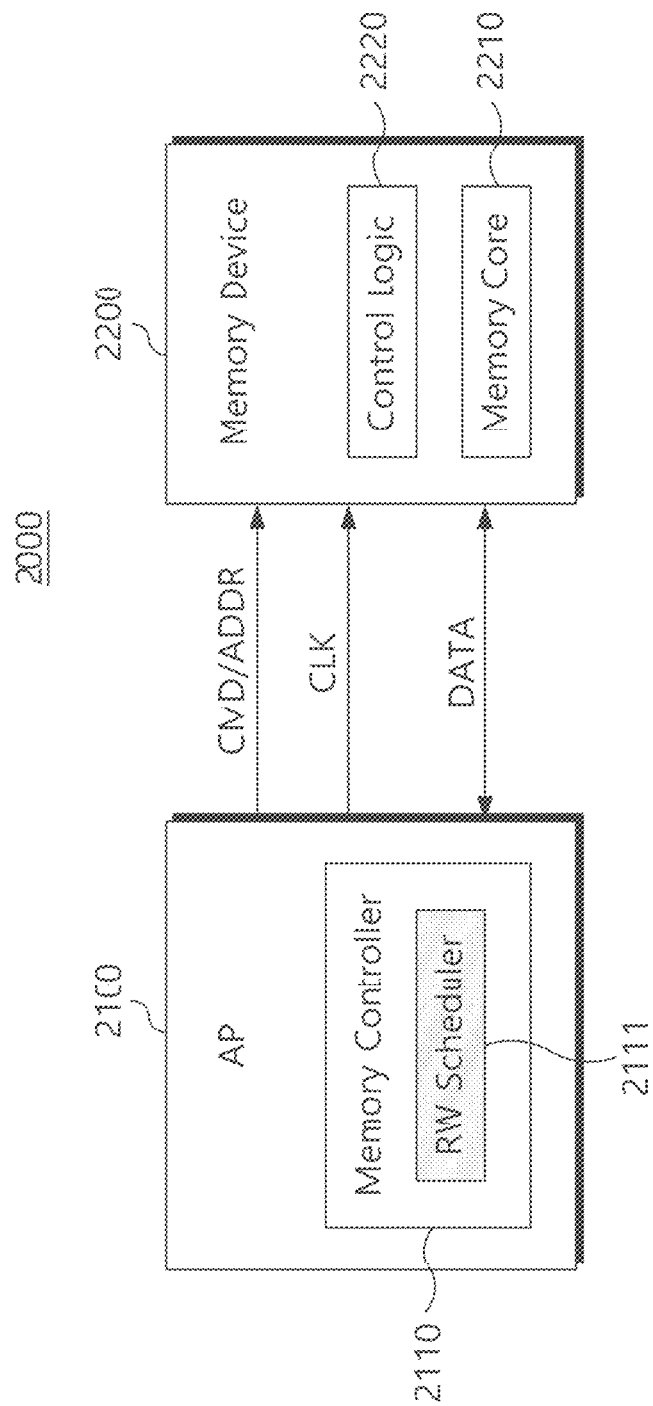
FIG. 12 is a diagram illustrating a mobile system according to some example embodiments.

FIG. 12 is a diagram illustrating a mobile system according to some example embodiments. Referring to FIG. 12, a mobile system 2000 may include an application processor 2100 and a memory device 2200. The application processor 2100 may include a memory controller 2110. The memory device 2200 may include control logic 2220 and a memory core 2210.

According to some example embodiments, the memory controller 2110 may control an overall operation of the memory device 2200 by providing various kinds of signals to the memory device 2200. For example, the memory controller 2110 may control a memory access operation of the memory device 2200, such as a read operation or a write operation. The memory controller 2110 may provide the command CMD and the address ADDR for the purpose of storing the data "DATA" in the memory device 2200 or reading the data "DATA" stored in the memory device 2200. Also, the memory controller 2110 may further provide the clock signal CLK to the memory device 2200.

According to some example embodiments, the memory device 2200 may output the data "DATA" read-requested by the memory controller 2110 to the memory controller 2110 or may store the data "DATA" write-requested by the memory controller 2110 in memory cells. The memory device 2200 may input/output the data "DATA" based on the command CMD, the address ADDR, and the clock signal CLK. The memory device 2200 may include the memory core 2210 and the control logic 2220. The memory core 2210 may include a memory cell array that is divided in units of bank. The memory cell array may include a plurality of memory banks.

According to some example embodiments, the memory controller 2110 may include a read-write scheduler 2111. For example, the read-write scheduler 2111 may determine the order of sending the bank requests (e.g., the active request and the precharge request) and the I/O requests (e.g., the read request and the write request) to the memory device 2200. The bank request may include a bank request corresponding to the read request or a bank request corresponding to the write request. The read-write scheduler 2111 may schedule the read request and the write request so as to be separately transferred. The read-write scheduler 2111 may determine a turn based on a specified unit (e.g., the specified number of requests or a specified time) and may perform scheduling such that a given amount of read requests or write request are transferred. The memory controller 2110 may perform the read-write scheduling operation based on at least one of the methods described with reference to FIGS. 6 to 11.

According to some example embodiments, the memory controller 2110 (or read-write scheduler 2111) may schedule the read request and the write request so as to be separately transferred. For example, the read-write scheduler 2111 may determine a turn based on a specified unit (e.g., the specified number of requests or a specified time) and may perform scheduling such that a given amount of read requests or write request are transferred. As an example, the read-write scheduler 2111 may set a read-write switching point where a turn where read requests are performed and a turn where write requests are performed are switched. The read-write scheduler 2111 may set the read-write switching point based on the number of requests that are performed in the read turn or the write turn. Alternatively, the read-write scheduler 2111 may set the read-write switching point based on a time during which the read turn or the write turn is performed.

According to some example embodiments, the memory controller 2110 (or the read-write scheduler 2111) may set the near switching point before the read-write switching point. Between the near switching point and the read-write switching point, the memory controller 2110 (or the read-write scheduler 2111) may block the scheduling of unnecessary bank requests. As such, unnecessary power consumption of the memory controller 2110 (or the read-write scheduler 2111) may be reduced. Also, the memory controller 2110 (or the read-write scheduler 2111) may schedule a bank request of a next turn so as to be placed between the near switching point of this turn and the read-write switching point. As such, a data blank time before and after the read-write switching point may decrease compared to the case of FIG. 4. Accordingly, the latency that is necessary for read-write switching may decrease. This may mean that the performance of the mobile system 2000 is improved. Through the above method, the memory controller 2110 (or the read-write scheduler 2111) may make the memory bandwidth of the mobile system 2000 better.

According to some example embodiments, power consumption may be reduced by blocking unnecessary bank requests of this turn.

Also, according to some example embodiments, as some of bank requests of a next turn are scheduled to be issued in this turn, the latency according to read-write switching may decrease, and the bandwidth may increase.

Any of the elements and/or functional blocks disclosed above may include or be implemented in processing circuitry such as hardware including logic circuits; a hardware/software combination such as a processor executing software; or a combination thereof. For example, the memory controller 1100 and control logic 1220 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the present disclosure has been described with reference to example embodiments thereof, it will be apparent to those of ordinary skill in the art that various changes and modifications may be made thereto without departing from the spirit and scope of the example embodiments as set forth in the following claims.

What is claimed is:

1. A memory system comprising:
a memory device including a memory cell array divided into a plurality of memory banks; and
a memory controller configured to send read requests or write requests to the memory device for inputting data to or outputting data from the memory banks of the memory cell array, respectively, and to send the read requests so as to be separated from the write requests based on a read-write switching point, wherein the memory controller is configured to in a first turn of input/output (I/O) requests including the read requests or the write requests, set a near switching point before the read-write switching point based on a number of I/O requests processed in the first turn from among the I/O requests, block scheduling at least one of first bank requests, between the near switching point and the read-write switching point for at least one first preliminary I/O request to be scheduled in the first turn, the at least one of the first bank requests indicating state switching of the memory banks, and schedule at least one of second bank requests so as to be issued between the near switching point and the read-write switching point, for second preliminary I/O requests to be scheduled in a second turn after the read-write switching point, the at least one of the second bank requests indicating state switching of the memory banks.

2. The memory system of claim 1, wherein at least one of the first bank requests and the second bank requests include:

an active request for setting one of the memory banks to an active state; and a precharge request for setting a memory bank being in the active state from among the memory banks to a standby state.

3. The memory system of claim 1, wherein the memory controller is configured to set the read-write switching point based on a max request number of I/O requests to be performed in the first turn or based on a specified time.

4. The memory system of claim 3, wherein the memory controller is configured to:

obtain a number of page-hit requests from among the I/O requests to be scheduled in the first turn, each of the page-hit requests included in the number of page-hit requests having the same bank values and the same row values as memory banks currently in an active state; and set a time point as the near switching point in response to the number of page-hit requests being smaller than a difference value of a max request number and a number of the I/O requests processed in the first turn, the time point being associated with the I/O requests processed in the first turn being completely issued.

5. The memory system of claim 1, wherein, the memory controller is configured to, between the near switching point and the read-write switching point, not schedule, in the first turn, I/O requests with bank and row values different from those of memory banks currently being in an active state from among I/O requests scheduled in the first turn.

6. The memory system of claim 5, wherein, the memory controller is configured to, between the near switching point and the read-write switching point, schedule, in the first turn, all I/O requests with bank and row values identical to those of the memory banks currently being in the active state from among the I/O requests to be performed in the first turn.

7. The memory system of claim 1, wherein the memory controller includes a read request queue configured to store the read requests received from a host, a write request queue configured to store the write requests received from the host, a read-write scheduler configured to schedule the read requests or the write requests based on a state of the memory banks, so as to be issued in the first turn or the second turn, and an arbitration circuit configured to send the read requests, the write requests, and bank requests for state switching of the memory banks to the memory device based on a scheduling result of the read-write scheduler.

8. The memory system of claim 7, wherein at least one of the read request queue includes bank information and row information corresponding to each of the read requests and includes valid information indicating whether the read requests are processed, and the write request queue includes bank information and row information corresponding to each of the write requests.

9. The memory system of claim 8, wherein, in response to one of the read requests or the write requests being transferred to the memory device by the arbitration circuit, the read-write scheduler is configured to:

update the bank information, the row information, and the valid information of the read request queue or the write request queue; and determine the near switching point based on the updated row information, and the updated valid information of the read request queue or the write request queue.

10. The memory system of claim 7, wherein the arbitration circuit is configured to determine priorities in an order of the I/O requests, active requests corresponding to the I/O requests, and precharge requests corresponding to the I/O requests based on the scheduling result of the read-write scheduler.

11. The memory system of claim 1, wherein the memory controller is configured to schedule an I/O request corresponding to at least one of the second bank requests scheduled between the near switching point and the read-write switching point, so as to be first issued in the second turn.

12. A memory system comprising:

a memory device including a memory cell array divided into a plurality of memory banks; and a memory controller configured to send read requests or write requests to the memory device for inputting data to or outputting data from the memory banks of the memory cell array, respectively, and to send the read requests so as to be separated from the write requests based on a read-write switching point, wherein the memory controller is configured to in a first turn of input/output (I/O) requests including the read requests or the write requests, set a near switching point before the read-write switching point based on a number of I/O requests processed in the first turn from among the I/O requests, and block scheduling a first active request between the near switching point and the read-write switching point for at least one preliminary I/O request to be scheduled in the first turn, the first active request indicating to set one of the memory banks to an active state.

13. The memory system of claim 12, wherein the memory controller is configured to block scheduling a first precharge request between the near switching point and the read-write switching point for the at least one preliminary I/O request, the first precharge request indicating to switch a memory bank in an active state from among the memory banks to a standby state.

14. The memory system of claim 13, wherein, the memory controller is configured to, in a second turn of the I/O requests, schedule a second active request or a second precharge request for an I/O request having the same bank address as a memory bank corresponding to the first active request, so as to be first scheduled in the second turn.

15. The memory system of claim 14, wherein, the memory controller is configured to, in the second turn of the I/O requests, schedule a third active request for an I/O request having the same bank address as a memory bank corresponding to the first precharge request, so as to be scheduled immediately after the second active request or the second precharge request.

16. An operating method of a memory system, the method comprising:
- in a first turn of input/output (I/O) requests including read requests or write requests transferred to a memory device from a memory controller, setting a read-write switching point based on a max request number of I/O requests to be performed in the first turn or based on a specified time;
- setting a near switching point before the read-write switching point based on a number of I/O requests processed in the first turn from among the I/O requests;
- blocking scheduling at least one first bank request between the near switching point and the read-write switching point for at least one first preliminary I/O request to be scheduled in the first turn, the at least one first bank request indicating state switching of memory banks included in the memory device; and
- scheduling at least one of second bank requests so as to be issued between the near switching point and the read-write switching point, for second preliminary I/O requests to be scheduled in a second turn after the read-write switching point, the at least one of the second bank requests indicating state switching of the memory banks.

17. The method of claim 16, wherein the setting of the near switching point includes:
- obtaining a number of page-hit requests from among I/O requests to be performed in the first turn, the page-hit requests having the same bank values and the same row values as memory banks currently being in an active state; and
- setting a time point as the near switching point, in response to the number of the page-hit requests being smaller than a difference value of the max request number and the number of I/O requests processed in the first turn, the time point being associated with the I/O requests processed in the first turn being completely issued.

18. The method of claim 16, further comprising:
between the near switching point and the read-write switching point, blocking I/O requests with bank and row values different from those of memory banks currently being in an active state from among I/O requests scheduled in the first turn from being scheduled in the first turn.

19. The method of claim 18, further comprising:
between the near switching point and the read-write switching point, scheduling all I/O requests with bank and row values equal to as those of the memory banks currently being in the active state from among I/O requests scheduled in the first turn, so as to be issued in the first turn.

20. The method of claim 16, further comprising:
scheduling an I/O request corresponding to at least one of the second bank requests scheduled between the near switching point and the read-write switching point, so as to be first issued in the second turn.

* * * * *

UNITED STATES PATENT AND TRADEMARK OFFICE
CERTIFICATE OF CORRECTION

PATENT NO. : 12,079,491 B2
APPLICATION NO. : 18/150626
DATED : September 3, 2024
INVENTOR(S) : Taewoo Han et al.

Page 1 of 1

It is certified that error appears in the above-identified patent and that said Letters Patent is hereby corrected as shown below:

On the Title Page

Item (73) should read:
-- Samsung Electronics Co., Ltd., Gyeonggi-do (KR) --

Signed and Sealed this
First Day of April, 2025

Coke Morgan Stewart
*Acting Director of the United States Patent and Trademark Office*